United States Patent
Bavois

(10) Patent No.: US 10,025,340 B2
(45) Date of Patent: Jul. 17, 2018

(54) METHOD FOR OPTIMISING A WETTING CURRENT AND ADAPTED DEVICE FOR MONITORING SENSORS WITH CONTACT SWITCHES

(71) Applicants: CONTINENTAL AUTOMOTIVE FRANCE, Toulouse (FR); CONTINENTAL AUTOMOTIVE GMBH, Hannover (DE)

(72) Inventor: Thierry Bavois, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/547,955

(22) PCT Filed: Feb. 4, 2016

(86) PCT No.: PCT/EP2016/000180
§ 371 (c)(1),
(2) Date: Aug. 1, 2017

(87) PCT Pub. No.: WO2016/124333
PCT Pub. Date: Aug. 11, 2016

(65) Prior Publication Data
US 2018/0024585 A1 Jan. 25, 2018

(30) Foreign Application Priority Data

Feb. 4, 2015 (FR) .................................... 15 50877

(51) Int. Cl.
*G05F 5/00* (2006.01)
*G01R 19/25* (2006.01)

(52) U.S. Cl.
CPC ........... *G05F 5/00* (2013.01); *G01R 19/2503* (2013.01)

(58) Field of Classification Search
CPC ..... G05F 1/10; G05F 1/46; G05F 1/56; G05F 1/561; G05F 3/26; G01R 19/16509;
(Continued)

(56) References Cited

U.S. PATENT DOCUMENTS 6,054,778 A 4/2000 Downs
6,800,965 B1 10/2004 Turner et al.
(Continued)

FOREIGN PATENT DOCUMENTS

EP 2 056 083 A2 5/2009
WO 01/43151 A1 6/2001

OTHER PUBLICATIONS

International Search Report, dated May 13, 2016, from corresponding PCT/EP2016/000180 application.

*Primary Examiner* — Emily P Pham
*Assistant Examiner* — Shahzeb K Ahmad
(74) *Attorney, Agent, or Firm* — Young & Thompson

(57) ABSTRACT

Disclosed is a method for optimizing a wetting current, for a device for monitoring sensors with contact switches including a current source and at least two switch/resistor assemblies (CT1/R1, CT2/R2) in parallel, including the following steps: the current source (A) supplies the circuit with a nominal current; if a voltage (Vm) measured across the terminals of the switch/resistor assemblies is greater than a threshold voltage (Vs), the threshold voltage being lower than the supply voltage of the current source and than the saturation voltage of the analog-to-digital converter (CAN), then the current source is stopped and a unit for discharging the circuit are implemented; and the current source supplies the circuit again with a supply current (Iwet_c) equal to the
(Continued)

nominal current reduced by a predetermined increment. These two last steps are repeated until the measured voltage is lower than the threshold voltage.

20 Claims, 1 Drawing Sheet

(58) Field of Classification Search
CPC ................ G01R 19/503; G01R 31/327; G01R 31/3274; G01R 31/3275; G01R 31/3277; G01R 31/006
See application file for complete search history.

(56) References Cited

U.S. PATENT DOCUMENTS

| | | |
|---|---|---|
| 2012/0146404 A1 | 6/2012 | Fuchida et al. |
| 2014/0312871 A1 | 10/2014 | Alley |
| 2016/0061898 A1* | 3/2016 | Edwards ............ G01R 31/3277 324/762.09 |
| 2016/0091908 A1* | 3/2016 | Edwards ................... G05F 1/56 323/274 |
| 2016/0131713 A1* | 5/2016 | Edwards ............ G01R 31/3274 324/415 |

* cited by examiner

METHOD FOR OPTIMISING A WETTING CURRENT AND ADAPTED DEVICE FOR MONITORING SENSORS WITH CONTACT SWITCHES

The invention relates to devices for monitoring sensors with contact switches, such as those used to ascertain the open or closed state of mechanical switches by means of an electronic circuit. For example, in the motor vehicle sector, contact switches of this kind make it possible to determine whether a hood or a door are open or closed, to ascertain the 'fastened' or 'unfastened' status of a seatbelt, etc.

In a simplified manner, the principle of operation of these devices consists in using assemblies comprising a single-contact switch and a resistor to determine whether a contact is closed or not, and deducing therefrom that a door of a vehicle is open, for example.

To achieve this, it is sought to measure the value of resistances to determine whether one or more contact switches is/are open or closed. In general, in particular in the motor vehicle sector, a plurality of assemblies formed of a contact switch and of a resistor are thus wired in parallel in order to enable a plurality of different sensors to be monitored by calculating the value of the equivalent resistance between the terminals of said assemblies wired in parallel.

Thus, for example, a device for monitoring single-contact sensors may comprise two assemblies wired in parallel and each comprising a contact switch and a first resistor with a resistance of 50 ohms and a second resistor with a resistance of 100 ohms, respectively, and a total capacitance of the corresponding cable. The circuit is supplied by a 5-volt power supply across the terminals of an input resistor. Using an analog-to-digital converter and by means of a 'divider bridge' calculation, the voltage across the terminals of the contact switch/resistor assemblies is determined, and the value of the total resistance between the terminals of said assemblies is deduced therefrom. From this value, it emerges that either one, both or neither of the two contact switches is/are closed. Specifically, with reference to the numerical values above, if the total resistance calculated between the terminals of the switch/resistor assemblies has a value of 33 ohms, then the two switches are closed. If the total resistance calculated between the terminals of the switch/resistor assemblies has a value of 50 ohms, then only the switch in series with the first resistor is closed. Finally, if the total resistance calculated between the terminals of the switch/resistor assemblies has a value of 100 ohms, then only the switch in series with the second resistor is closed.

In this technical context, known to those skilled in the art, the input resistor is dimensioned such that the current in the branches of the circuit corresponding to each of the switch/resistor assemblies is able to be measured, and therefore sufficiently high.

Furthermore, to perform a 'divider bridge' calculation, it is necessary to measure, for each calculation, two voltages in the circuit, i.e. the voltage corresponding to the divider bridge, but also the supply voltage, which is equal to 5 volts in this example.

To mitigate this problem, it has been proposed in the prior art to use a current source, and not a voltage source, as a power supply.

The problem that stems from using a current source lies in the fact that the voltage across the terminals of the switch/resistor assemblies may be greater than the supply voltage of the current source. It may also be greater than the saturation voltage of the analog-to-digital converter.

Specifically, in the context of a motor vehicle, the supply of power available to supply the current source is provided by the battery; it is a question of the supply voltage of the battery. This is at most 12 volts in theory. In practice, and in particular in the case of a vehicle fitted with 'stop and go' technology, meaning stopping and restarting (the engine) in practice, depending on the situation, the supply voltage actually provided to such a current source is around 4-5 volts.

Another general problem linked with the use of a monitoring device of the type comprising single-contact switches is that it is important to be able to determine the value of resistances over the widest possible spectrum. In this sense, in the motor vehicle sector, it is common to use a plurality of switch/resistor assemblies having set resistance values.

One constraint lies, furthermore, in the fact that it is necessary, in this type of device, to ensure that the contacts are deoxidized. In the motor vehicle sector, a minimum current, called the 'wetting current' to use the expression well known to those skilled in the art, is also generally set.

There is therefore a need to find a means such that, in a device of this kind, the current source is not able to be saturated. To this end, the present invention relates to a method for regulating wetting current, intended to be implemented by a device for monitoring sensors with contact switches, said method and said device enabling a supply of current that is sufficient, at least initially, to deoxidize the contacts, and regulated, by virtue of the method according to the invention, to have a maximum value that does not bring about saturation of the current source.

More precisely, the present invention relates to a method for optimizing a wetting current, intended to be implemented by a device for monitoring sensors with contact switches forming a circuit comprising a current source supplied by a supply voltage, at least two assemblies including a contact switch and a resistor in series, said at least two assemblies being wired in parallel, and an analog-to-digital converter having a saturation voltage. The method according to the invention is noteworthy in that it comprises the following steps:

- a first step in which the current source supplies the circuit with a nominal current that is greater than the required wetting current by means of a first control bus;
- a second step in which, if a voltage measured across the terminals of said contact switch/resistor assemblies is greater than a predetermined threshold voltage, said threshold voltage being selected so as to be lower than the supply voltage of the current source, then the current source is stopped and means for discharging the circuit are implemented by means of a second control bus;
- a third step in which, if the second step has brought about the stoppage of the current source and the discharging of the circuit, then the current source, at the end of the second step, supplies the circuit again with a supply current equal to the nominal current reduced by a predetermined increment.

At the end of the third step, the second step is implemented again until the voltage measured across the terminals of said two contact switch/resistor assemblies is lower than the threshold voltage.

In this way, the wetting current is automatically regulated to the maximum value that does not saturate the current source.

According to one embodiment, the method according to the invention also comprises a fourth step in which a stabilization time delay is implemented, at the end of the third step, during which the voltage across the terminals of the contact switch/resistor assemblies is measured in order to ensure that said voltage remains lower than the threshold voltage, it being understood that if, during the stabilization time delay, said voltage across the terminals of the contact switch/resistor assemblies exceeds the threshold voltage, then the second step is implemented again.

The method preferably also comprises a step of calculating the value of the equivalent resistance between the terminals of said contact switch/resistor assemblies, using the analog-to-digital converter.

It is thus possible to determine which of the switches is or are open and closed, respectively.

According to one embodiment, during the third step, the discharging is deemed to have finished once the voltage measured across the terminals of said contact switch/resistor assemblies falls below a discharge threshold voltage, which is predetermined as being equal to the threshold voltage reduced by a margin.

This enables the length of time before the current source may be restarted to be decreased, and therefore a faster regulation of the optimum wetting current. The discharging of the circuit is thus controlled by the presence of a second comparator.

According to one embodiment, the threshold voltage is selected so as to be lower than the saturation voltage of the analog-to-digital converter, so as to guarantee that the analog-to-digital converter does not saturate, without having to resort to an automatic gain control device.

According to one embodiment, the threshold voltage is configured in real time depending on the supply voltage of the current source. This makes it possible to take account of the variability of the voltage supplying the current source, as may occur, in particular, in the context of a motor vehicle, while keeping a wetting current automatically regulated to an optimum value.

According to one embodiment, after the calculation of the value of said equivalent resistance between the terminals of the contact switch/resistor assemblies, corresponding to a first calculation, a second measurement of the voltage across the terminals of the contact switch/resistor assemblies is performed with a supply current that is lower than the supply current that enabled the first calculation, for the purpose of performing a differential calculation making it possible to determine the value of said equivalent resistance more precisely.

This makes it possible, for example, to prevent problems of ground shifts between the body of an automobile and the electronic module.

The invention also relates to a device for monitoring sensors with contact switches forming a circuit, said device comprising:
  at least two assemblies formed of a contact switch and of a resistor in series, said two assemblies being wired in parallel,
  a current source supplied by a supply voltage,
  an analog-to-digital converter having a saturation voltage.

The device for monitoring sensors with contact switches according to the invention is noteworthy in that it moreover comprises:
  means for measuring the voltage across the terminals of said contact switch/resistor assemblies,
  means for comparing said measured voltage with a predetermined threshold voltage that is lower than the supply voltage of the current source,
  means for discharging the circuit,
and in that it is configured to implement the method such as briefly described above.

The discharging means may advantageously consist of a current source managed by a switch. This moreover contributes to the discharging of the capacitances that are wired in principle to the terminals of the contact switches.

The device according to the invention may advantageously comprise second means for comparing said measured voltages with a predetermined discharge threshold voltage, said discharge threshold voltage being equal to the threshold voltage reduced by a margin. The presence of these second comparing means makes it possible to be able to identify more quickly that the circuit has discharged sufficiently, and thus to restart the current source. In this way, the time taken to automatically regulate the wetting current is optimized.

The invention will be better understood upon reading the following description, given solely by way of example, and with reference to the appended drawings, in which.

It should be noted that the figures disclose the invention in a detailed manner so as to enable the implementation thereof, said figures also being able to serve to better define the invention, of course.

The invention is presented primarily for the purpose of an application in a motor vehicle. However, other applications are also covered by the present invention, in particular for the purpose of an implementation in any type of land vehicle.

As briefly explained above, in the motor vehicle sector, it is common to resort to contact switch devices. One common problem with these devices is linked to the fact that it is essential to ensure that the contacts are well deoxidized, such that the measured values are able to be considered as being correct. To this end, in order to guarantee the deoxidation of the contacts of the circuit, it is necessary to supply the device with a current that is greater than a set minimum value. The current supplied to these devices is thus termed 'wetting current' by those skilled in the art.

Figure 1:
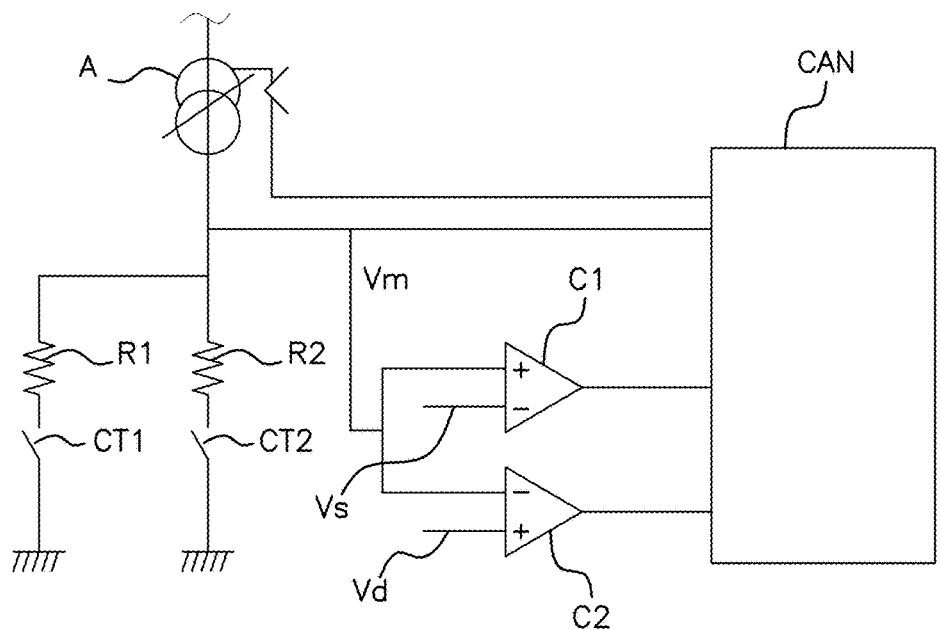
FIG. 1 shows a circuit diagram of a device able to implement the method according to the invention.

With reference to FIG. 1, the electronic circuit shown corresponds to a device for monitoring sensors with contact switches. In this context, the present invention relates to the regulation of wetting current, corresponding, in other words, to the optimization of the magnitude of the current supplied to the device, taking account of the constraints explained previously: ensuring the deoxidation of the contacts using a sufficiently high current, while not saturating the current source.

Specifically, the device for monitoring sensors with contact switches that is intended to implement the method according to the invention, and a circuit diagram of which device is shown in FIG. 1, is supplied by a current source A, by means of a first control bus. It comprises at least two assemblies comprising, in series, a contact switch CT1, CT2 and a resistor R1, R2, and, implicitly, a wiring capacitance (not shown), said two assemblies being wired in parallel in the circuit. The device may of course comprise a larger number of switch/resistor assemblies in parallel. The device furthermore comprises a first comparator C1 and, preferably, a second comparator C2, the operation of which is described below, in order to enable the discharging of the circuit to be managed in case of saturation. In nominal operation, that is to say outside of any saturation of the current source A, the measured voltage values are relayed to an analog-to-digital converter CAN responsible for processing them, and in particular for measuring the value of the equivalent resistance between the terminals of the contact switch/resistor assemblies CT1/R1, CT2/R2.

In this context, connections relating to the control of the current source A and to the output of the comparators C1, C2 are routed to a sequencer (not shown) in order to carry out the sequencing described below.

Figure 2:
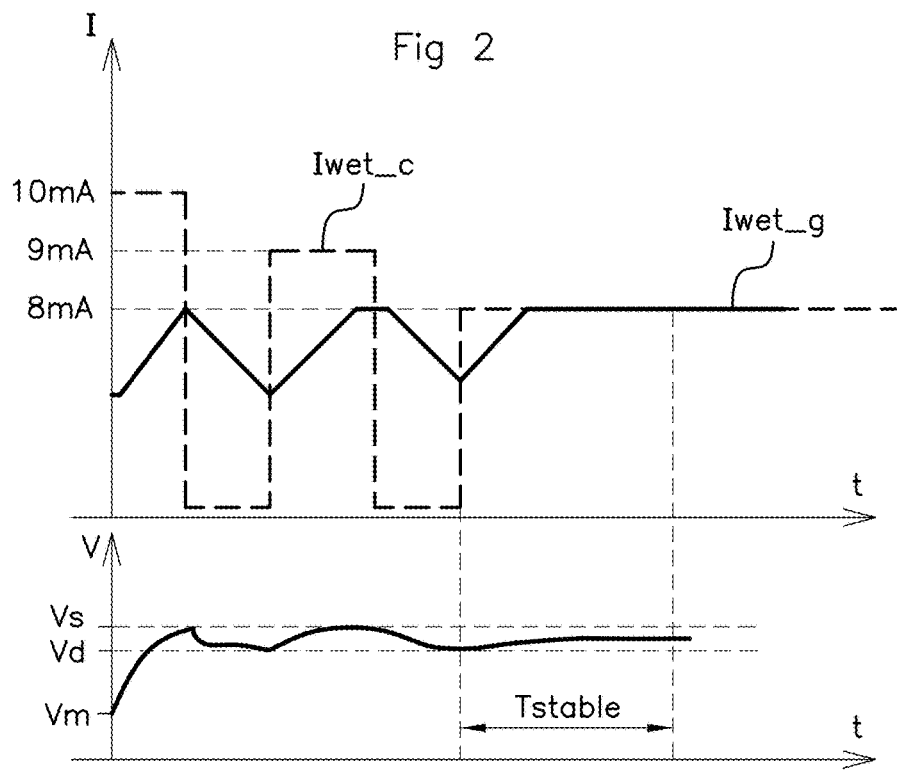
FIG. 2 shows the diagram, showing in particular the variation in the current and of the voltage as a function of time in the circuit formed by a device for monitoring sensors with contact switches implementing the method according to the invention.

With reference to FIG. 2, to begin with, the current source A starts by providing a nominal current having a magnitude, equal to 10 mA, for example, greater than the required minimum wetting current.

A threshold voltage Vs has been defined beforehand, said threshold voltage Vs corresponding to a maximum permitted voltage across the terminals of the switch/resistor assemblies CT1/R1, CT2/R2, in order not to saturate the current source A. This threshold voltage Vs is selected so as to be lower than the supply voltage of the current source A, with the aim of preventing any saturation of said source. Said threshold voltage Vs may preferably also be lower than the saturation voltage of the analog-to-digital converter CAN, in order to ensure that the latter is not saturated, without having to resort to an automatic gain control (AGC) device to limit the voltage at the input of the analog-to-digital converter CAN. The voltage may thus be measured at a point situated upstream of the input of the analog-to-digital converter.

Using a first comparator C1, the measured voltage Vm is compared with the threshold voltage Vs. If it is greater, then the current source A is stopped and the circuit is discharged by suitable discharging means (not shown) by means of a second control bus. These means for discharging the circuit may for example consist of one or more current sources managed by one or more switches.

After the circuit has discharged, with reference to FIG. 2, the current source A is restarted and supplies the circuit with a current Iwet_c having a magnitude equal to that of the nominal current reduced by a predetermined increment. For example, the predetermined increment may be equal to 1 mA and, in the first iteration, the supply current then has a magnitude equal to 9 mA.

The voltage is again measured upstream of the analog-to-digital converter CAN and, if the measured voltage Vm is still greater than the threshold voltage Vs, the operations of stopping the current source A and discharging the circuit are repeated. The magnitude of the supply current Iwet_c is again reduced by the predetermined increment, and the current source A supplies the circuit again with this new reduced supply current.

With reference to FIG. 1, it is to be noted that a second comparator C2 may preferably be inserted into the circuit in order to compare the voltage Vm measured across the terminals of the switch/resistor assemblies with a predetermined discharge threshold voltage Vd, said discharge threshold voltage Vd corresponding to the threshold voltage reduced by a margin. According to this embodiment, it is deemed that the circuit has discharged sufficiently once the voltage Vm across the terminals of the switch/resistor assemblies CT1/R1, CT2/R2, measured upstream of the analog-to-digital converter CAN, falls below the discharge threshold voltage Vd. The discharging is consequently stopped and the current source A is restarted, with a supply current Iwet_c reduced by the predetermined increment, as described previously.

The presence of the second comparator C2 makes it possible to optimize the time taken to regulate the wetting current, as it is not necessary to wait for the circuit to discharge completely. The iteration loop is then of short duration.

The method thus makes it possible, either directly with a current having a nominal magnitude, or after a certain number of iterations, to arrive at a situation whereby the supply current Iwet_g, with which the current source A supplies the circuit, does not cause the threshold voltage Vs to be exceeded.

Accordingly, with reference to FIG. 2, a stabilization time delay Tstable is preferably implemented. Specifically, if the voltage Vm measured across the terminals of the switch/resistor assemblies CT1/R1, CT2/R2 does not exceed the threshold voltage Vs, a stabilization time delay Tstable, corresponding to a predetermined duration, makes it possible to ensure that the voltage Vm in the circuit is well stabilized and lower than the threshold voltage Vs, and that the current source A is therefore not saturated. If, however, before the end of the stabilization time delay Tstable, the measured voltage Vm exceeds the threshold voltage Vs, then the steps of the method according to the invention, consisting in stopping the current source A, discharging the circuit, and then restarting the current source A with a supply current Iwet_c having a magnitude reduced by the predetermined increment, are repeated.

If the voltage Vm in the circuit, i.e. the voltage measured across the terminals of the switch/resistor assemblies CT1/R1, CT2/R2, is stable and lower than the threshold voltage Vs at the end of the stabilization time delay Tstable, it is deemed that the wetting current Iwet_g is optimally regulated. This wetting current consequently corresponds to the magnitude of the current supplied to the circuit forming, for example, a device for monitoring sensors with contact switches. The acquisition of the measurements by the analog-to-digital converter CAN, for the purpose of calculating the value of the equivalent resistance between the terminals of the contact switch/resistor assemblies CT1/R1, CT2/R2, may then begin.

Thus, with reference to FIG. 2, the method according to the invention enables automatic regulation of an optimum wetting current Iwet_g. For as long as the supply current causes the voltage Vm measured across the terminals of the switch/resistor assemblies CT1/R1, CT2/R2 to exceed the threshold voltage Vs, running the risk of bringing about saturation of the current source A, the method implements the step consisting in stopping the source A and in discharging the circuit. Once the voltage Vm measured across the terminals of the switch/resistor assemblies CT1/R1, CT2/R2 returns below a discharge threshold voltage Vd, the current source A may be restarted with a supply current Iwet_c reduced by a predetermined increment.

After several iterations, according to the example in FIG. 2, when the voltage Vm measured across the terminals of the switch/resistor assemblies CT1/R1, CT2/R2 remains lower than the threshold voltage Vs, and after having complied with a stabilization time delay Tstable, the optimum wetting current Iwet_g is achieved, in minimum time.

The method according to the invention may then include calculating the values of the equivalent resistance between the terminals of the switch/resistor assemblies CT1/R1, CT2/R2, simply by implementing the formula: $R = Vm/Iwet$, where R is the value of the equivalent resistance to be calculated, Vm is the voltage across the terminals of the contact switch/resistor assemblies CT1/R1, CT2/R2, and Iwet is the wetting current.

According to one embodiment, the method according to the invention optionally includes performing the calculation of the value of the equivalent resistance a second time, with a supply current having a magnitude again reduced by the predetermined increment with respect to the wetting current determined at the end of the method steps described above. In this way, it is guaranteed that the current source A is not saturated, and it is permissible to carry out a differential calculation for the purpose of obtaining a more accurate determination of the value of the equivalent resistance between the terminals of the switch/resistor assemblies CT1/R1, CT2/R2. This enables a more precise determination of the state of the monitored sensors, in particular in the case where there are a large number of switch/resistor assemblies wired in parallel.

According to one embodiment, provision is made for the threshold voltage Vs to be predetermined dynamically, in real time, depending on the voltage of the current source A. Specifically, in particular in the context of an application in the motor vehicle sector, the line voltage, provided by the battery, might not be constant and might depend on the situation of the vehicle and on the use of its equipment. For example, the line voltage provided by the battery may change depending on the started or stopped state of the engine, and the alternation of these states, in the context of a vehicle having a 'stop and go' engine system, create a certain instability in the line voltage provided by the battery, and therefore in the supply voltage of a current source supplying a device for monitoring sensors with contact switches.

According to one embodiment, the method according to the invention consequently includes measuring the voltage of the current source and determining the value of the threshold voltage depending on said measured value of the voltage of the current source. In this case, the threshold voltage Vs is preferably determined using the formula:

$$Vs = Va - Vs\_sat,$$

where Va is the supply voltage of the battery and Vs_sat is the saturation voltage of the current source.

The present invention also relates to a device for monitoring sensors with contact switches, comprising all of the means enabling the implementation of the method for regulating and optimizing wetting current described previously.

Such a device consists of an electronic circuit comprising a current source, at least two assemblies formed of a contact switch and of a resistor in series, said two assemblies being wired in parallel, and an analog-to-digital converter.

This device furthermore comprises means for measuring the voltage across the terminals of the switch/resistor assemblies, and a first comparator for comparing said voltage with a predetermined threshold voltage that is lower than the supply voltage of the current source. Said threshold voltage is preferably also lower than the saturation voltage of the analog-to-digital converter.

Moreover, the device comprises means for discharging the circuit, which may consist of capacitors wired in parallel with the switches.

The device according to the invention may also preferably comprise a second comparator for comparing the voltage measured across the terminals of the switch/resistor assemblies with a discharge threshold voltage corresponding to the threshold voltage reduced by a margin.

The device for monitoring sensors with contact switches according to the invention thus comprises means for implementing the method for optimizing wetting current described above.

In summary, the present invention relates to a method enabling the automatic regulation of the wetting current Iwet_g supplied to an electronic circuit forming a device for monitoring sensors with contact switches.

The method according to the invention in particular has the advantage of making it possible to optimize said wetting current, which is set to the highest value that does not saturate either the source or, as the case may be, the analog-to-digital converter.

The invention also covers a device for monitoring sensors with contact switches that is suitable for implementing such a method.

It is clarified furthermore that the present invention is not limited to the examples described above, and is open to many variants that are accessible to those skilled in the art.

The invention claimed is:

1. A method for optimizing a wetting current, intended to be implemented by a device for monitoring sensors with contact switches forming a circuit comprising a current source (A) supplied by a supply voltage, at least two assemblies including a contact switch (CT1, CT2) and a resistor (R1, R2) in series, said at least two assemblies (CT1/R1, CT2/R2) being wired in parallel, and an analog-to-digital converter (CAN) having a saturation voltage, the method comprising the following steps:
   a first step in which the current source (A) supplies the circuit with a nominal current by means of a first control bus;
   a second step in which, if a voltage (Vm) measured across the terminals of said contact switch/resistor assemblies (CT1/R1, CT2/R2) is greater than a predetermined threshold voltage (Vs), said threshold voltage (Vs) being selected so as to be lower than the supply voltage of the current source (A), then the current source is stopped and means for discharging the circuit are implemented by means of a second control bus;
   a third step in which, if the second step has brought about the stoppage of the current source (A) and the discharging of the circuit, then the current source (A) supplies the circuit again with a supply current equal to the nominal current reduced by a predetermined increment,
   wherein, at the end of the third step, the second step is implemented again until the voltage measured across the terminals of said two contact switch/resistor assemblies (CT1/R1, CT2/R2) is lower than the threshold voltage (Vs).

2. The method for optimizing a wetting current as claimed in claim 1, further comprising a fourth step in which a stabilization time delay (Tstable) is implemented, at the end of the third step, during which the voltage (Vm) across the terminals of the contact switch/resistor assemblies (CT1/R1, CT2/R2) is measured in order to ensure that said voltage (Vm) remains lower than the threshold voltage (Vs), it being understood that if, during the stabilization time delay (Tstable), said voltage (Vm) across the terminals of the contact switch/resistor assemblies (CT1/R1, CT2/R2) exceeds the threshold voltage (Vs), then the second step is implemented again.

3. The method for optimizing a wetting current as claimed in claim 2, wherein, during the third step, the discharging is deemed to have finished once the voltage (Vm) measured across the terminals of said contact switch/resistor assemblies (CT1/R1, CT2/R2) falls below a discharge threshold voltage (Vd), which is predetermined as being equal to the threshold voltage (Vs) reduced by a margin.

4. The method for optimizing a wetting current as claimed in claim 2, wherein the threshold voltage (Vs) is selected so as to be lower than the saturation voltage of the analog-to-digital converter (CAN).

5. The method for optimizing a wetting current as claimed in claim 2, wherein the threshold voltage (Vs) is configured in real time depending on the supply voltage of the current source (A).

6. The method for regulating a wetting current as claimed in claim 1, further comprising a step of calculating the value of the equivalent resistance between the terminals of said contact switch/resistor assemblies (CT1/R1, CT2/R2).

7. The method for optimizing a wetting current as claimed in claim 6, wherein, during the third step, the discharging is deemed to have finished once the voltage (Vm) measured across the terminals of said contact switch/resistor assemblies (CT1/R1, CT2/R2) falls below a discharge threshold voltage (Vd), which is predetermined as being equal to the threshold voltage (Vs) reduced by a margin.

8. The method for optimizing a wetting current as claimed in claim 6, wherein the threshold voltage (Vs) is selected so as to be lower than the saturation voltage of the analog-to-digital converter (CAN).

9. The method for optimizing a wetting current as claimed in claim 6, wherein the threshold voltage (Vs) is configured in real time depending on the supply voltage of the current source (A).

10. The method for optimizing a wetting current as claimed in claim 1, wherein, during the third step, the discharging is deemed to have finished once the voltage (Vm) measured across the terminals of said contact switch/resistor assemblies (CT1/R1, CT2/R2) falls below a discharge threshold voltage (Vd), which is predetermined as being equal to the threshold voltage (Vs) reduced by a margin.

11. The method for optimizing a wetting current as claimed in claim 10, wherein the threshold voltage (Vs) is selected so as to be lower than the saturation voltage of the analog-to-digital converter (CAN).

12. The method for optimizing a wetting current as claimed in claim 10, wherein the threshold voltage (Vs) is configured in real time depending on the supply voltage of the current source (A).

13. The method for optimizing a wetting current as claimed in claim 1, wherein the threshold voltage (Vs) is selected so as to be lower than the saturation voltage of the analog-to-digital converter (CAN).

14. The method for optimizing a wetting current as claimed in claim 13, wherein the threshold voltage (Vs) is configured in real time depending on the supply voltage of the current source (A).

15. The method for optimizing a wetting current as claimed in claim 1, wherein the threshold voltage (Vs) is configured in real time depending on the supply voltage of the current source (A).

16. The method for optimizing a wetting current as claimed in claim 1, wherein, after the calculation of the value of said equivalent resistance between the terminals of the contact switch/resistor assemblies (CT1/R1, CT2/R2), corresponding to a first calculation, a second measurement of the voltage across the terminals of the contact switch/resistor assemblies (CT1/R1, CT2/R2) is performed with a supply current that is lower than the supply current that enabled the first calculation, for the purpose of performing a differential calculation making it possible to determine the value of said equivalent resistance more precisely.

17. A device for monitoring sensors with contact switches forming a circuit intended to implement the method as claimed in claim 1, said device comprising:
- at least two assemblies (CT1/R1, CT2/R2) formed of a contact switch and of a resistor in series, said two assemblies being wired in parallel,
- a current source (A) supplied by a supply voltage,
- an analog-to-digital converter (CAN) having a saturation voltage,
- said device for monitoring sensors with contact switches further comprising:
- means for measuring the voltage across the terminals of said contact switch/resistor assemblies (CT1/R1, CT2/R2),
- means (C1) for comparing said measured voltage (Vm) with a predetermined threshold voltage (Vs) that is lower than the supply voltage of the current source (A),
- means for discharging the circuit,
- and wherein it is configured to implement the method as claimed in claim 1.

18. The device as claimed in claim 17, wherein the discharging means consist of a current source managed by a switch.

19. The device as claimed in claim 18, further comprising second means (C2) for comparing said measured voltage (Vm) with a predetermined discharge threshold voltage (Vd), said discharge threshold voltage (Vd) being equal to the threshold voltage (Vs) reduced by a margin.

20. The device as claimed in claim 17, further comprising second means (C2) for comparing said measured voltage (Vm) with a predetermined discharge threshold voltage (Vd), said discharge threshold voltage (Vd) being equal to the threshold voltage (Vs) reduced by a margin.

* * * * *